United States Patent
Naoe (10) Patent No.: US 8,778,779 B2
(45) Date of Patent: Jul. 15, 2014

(54) SEMICONDUCTOR DEVICE AND A METHOD FOR PRODUCING SEMICONDUCTOR DEVICE

(75) Inventor: Mitsufumi Naoe, Akiruno (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 13/571,699

(22) Filed: Aug. 10, 2012

(65) Prior Publication Data

US 2013/0082408 A1  Apr. 4, 2013

(30) Foreign Application Priority Data

Oct. 4, 2011  (JP) ................. 2011-220008

(51) Int. Cl.
*H01L 21/00* (2006.01)
*H01L 23/544* (2006.01)

(52) U.S. Cl.
USPC .......... 438/462; 439/694; 439/975; 257/797; 257/620; 257/E23.179; 257/E21.24; 250/559.3

(58) Field of Classification Search
USPC .......... 438/401, 462, 17, 694, 975; 257/797, 257/E23.179, 620, E21.24; 250/559.3
See application file for complete search history.

(56) References Cited

U.S. PATENT DOCUMENTS

| | | | | |
|---|---|---|---|---|
| 5,656,229 A | * | 8/1997 | Tanimoto et al. | 264/400 |
| 6,433,352 B1 | * | 8/2002 | Oka | 250/559.3 |
| 6,632,744 B2 | * | 10/2003 | Imai et al. | 438/692 |
| 6,713,231 B1 | * | 3/2004 | Hasegawa et al. | 430/311 |
| 8,367,432 B2 | * | 2/2013 | Shinkawata | 438/14 |
| 2008/0096113 A1 | | 4/2008 | Naoe | |

FOREIGN PATENT DOCUMENTS

| | | |
|---|---|---|
| JP | 2005-277232 A | 10/2005 |
| JP | 2008-102360 A | 5/2008 |

* cited by examiner

*Primary Examiner* — Jasmine Clark
(74) *Attorney, Agent, or Firm* — Westerman, Hattori, Daniels & Adrian, LLP (57) ABSTRACT

A method for producing semiconductor device includes: performing first, second and third exposures of a photoresist film formed on a semiconductor wafer via a mask; wherein: first, second and third shot regions respectively defined by the first, second and third exposures are aligned in a first direction; the mask has a shot region including a peripheral scribe region having a first and second side crossing the first direction; the photoresist film is of positive type, a first pattern is formed as a light shielding pattern disposed on the first side, and a second pattern is formed as a light transmitting region disposed on the second side; the first and second exposures are performed in such a manner that the first and second patterns do not overlap each other; and the second and third exposures are performed in such a manner that the first and second patterns overlap each other.

15 Claims, 11 Drawing Sheets

SEMICONDUCTOR DEVICE AND A METHOD FOR PRODUCING SEMICONDUCTOR DEVICE

CROSS-REFERENCE TO RELATED APPLICATION

This application is based upon and claims the benefit of priority of the prior Japanese Patent Application No. 2011-220008, filed on Oct. 4, 2011, the entire contents of which are incorporated herein by reference.

FIELD

The embodiments discussed herein are related to a semiconductor device and a method for producing a semiconductor device.

BACKGROUND

For the numerous semiconductor chips formed on a semiconductor wafer, the individual chips are managed in such processes as primary test (PT) and mounting (assembling) (for example, see JP2005-277232A). For managing individual chips, a reference chip is specified, and the other chips are specified on the basis of the reference chip.

Since the diameter of a semiconductor wafer becomes larger while the size of chips becomes smaller, the number of chips on a wafer reaches tens of thousands to hundreds of thousands (for example, the number of 1 mm square chips formed on a semiconductor wafer with a diameter of 300 mm is approx. 65000), making it difficult to specify the reference chip on a wafer.

Meanwhile, in the technique disclosed in JP2008-102360A, inspection marks for inspecting whether or not a mask pattern for forming semiconductor chips is formed as designed are formed on the peripheral scribe region of an exposure mask (reticle). The inspection marks are transferred onto a photoresist film when the semiconductor wafer is exposed via the exposure mask. Consequently, the exposure process is performed in such a manner that the inspection marks may be erased when the region having the inspection marks transferred thereon is irradiated with light in the subsequent exposure. The inspection marks are erased on the entire surface of the semiconductor wafer.

SUMMARY

According to one aspect of the present invention, a method for producing semiconductor device includes: performing a first exposure of a photoresist film formed on a semiconductor wafer via an exposure mask; performing a second exposure of the photoresist film via the exposure mask; and performing a third exposure of the photoresist film via the exposure mask, wherein: a second shot region projected onto the photoresist film by the second exposure is adjacent in a first direction to a first shot region projected onto the photoresist film by the first exposure, and a third shot region projected onto the photoresist film by the third exposure is adjacent in the first direction to the second shot region; the exposure mask is such that a shot region projected on the semiconductor wafer by one exposure has a rectangular form; the shot region includes a peripheral scribe region disposed at peripheral portion of the shot region and a chip region disposed inside the peripheral scribe region; the peripheral scribe region has a first side and a second side opposite to each other and crossing the first direction, and a third side and a fourth side opposite to each other and parallel to the first direction; a first pattern is disposed on the first side, and a second pattern is disposed on the second side at a position opposite to the first pattern; the photoresist film is of positive type, and the first pattern is formed as a light shielding pattern while the second pattern is formed as a light transmitting region with a size to contain the first pattern, or the photoresist film is of negative type, and the first pattern is formed as a light transmitting pattern while the second pattern is formed as a light transmitting region with a size to contain the first pattern; the first exposure and the second exposure are performed in such a manner that the first shot region and the second shot region do not overlap each other and that the first pattern of either of the first shot region and the second shot region and the second pattern of the other of the first shot region and the second shot do not overlap each other; and the second exposure and the third exposure are performed in such a manner that the first pattern of either of the second shot region and the third shot region and the second pattern of the other of the second shot region and the third shot region overlap each other.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

At first, a method for producing a semiconductor device as a comparative example is explained.

Figure 8A:
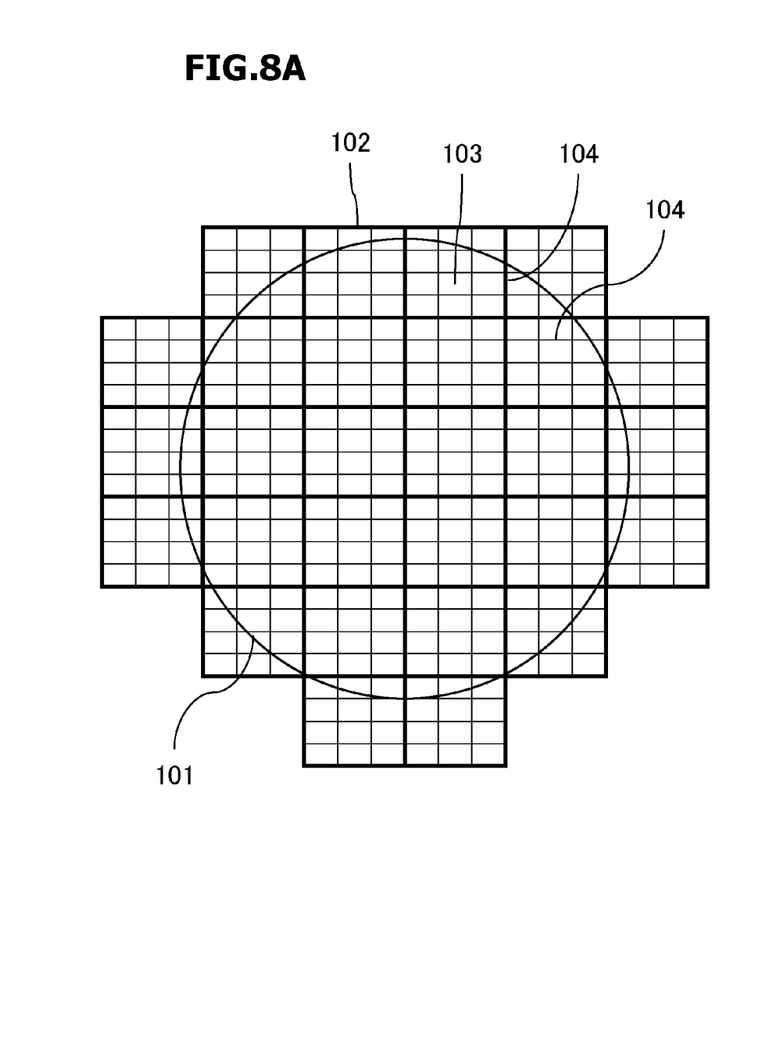
FIG. 8A is a wafer map view in a comparative example.

FIG. 8A is a wafer map diagram of the comparative example. A semiconductor wafer (101) having a photoresist film formed thereon is exposed via an exposure mask. The shot regions (102) exposed one by one are scanned on a semiconductor wafer (101), to perform pattern transfer on the entire surface of the photoresist film. The edges of the shot regions (102) are indicated by heavy lines.

The exposure mask is, for example, a 3×4 block reticle, and in each of the shot regions (102), 12 chip regions (103) are arranged in 3 columns and 4 rows. In the peripheral portion of the shot regions (102) and between the chip regions (103) adjacent to each other, scribe regions (104) are arranged.

In the comparative example, all the shot regions (102) are scanned in the state where the scribe regions of the peripheral portions of the shot regions (102) respectively adjacent to each other are overlapped each other.

As for the multiple chips formed on the semiconductor wafer, in the test process and the assembling (cutting) process, each chip is managed. For this purpose, a reference chip to be referred to is specified, and the other chips are specified on the basis of the relative positional relationships with the reference chip. On the semiconductor wafer, marks for specifying a reference chip are formed. The reference chip can be specified on the basis of the relative positional relationships with the marks.

The marks in the comparative example are formed by leaving specific shot regions non-exposed in the exposure process of forming a resist mask for patterning a specific layer (for example, an aluminum wiring layer).

Figure 8B:
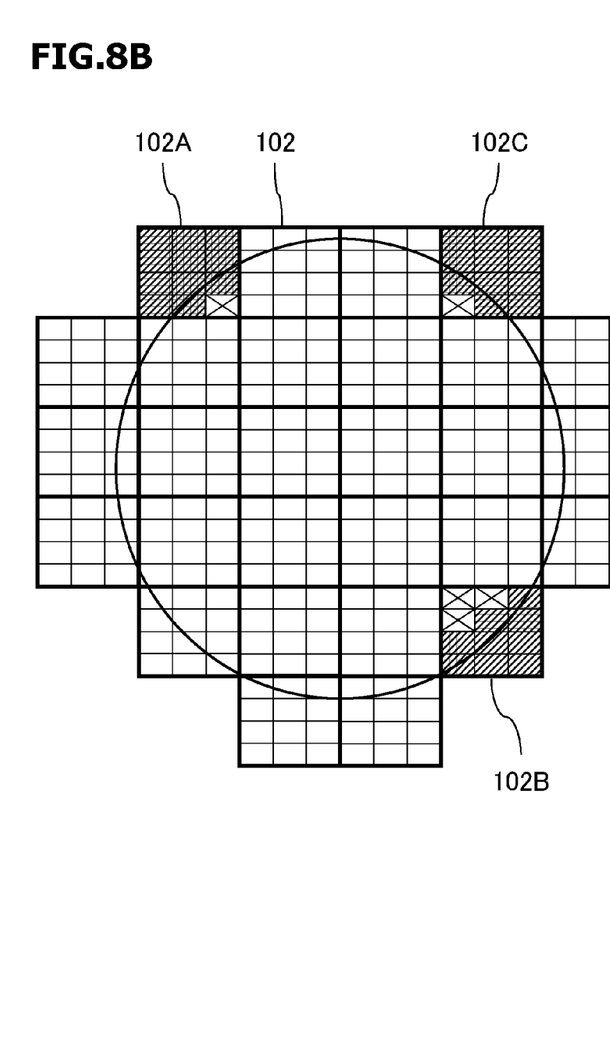
FIG. 8B is a schematic plan view illustrating an example of non-exposed shot regions in the comparative example.

FIG. 8B is a schematic plan view of a semiconductor wafer illustrating an example of non-exposed shot regions in the comparative example. In this example, shot region (102A) at the upper left edge portion, shot region (102B) at the lower right edge portion and shot region (102C) at the upper right edge portion are not exposed. The non-exposed shot regions (102A), (102B) and (102C) are indicated by rightward rising hatching lines. Meanwhile, the chip regions indicated by cross hatching in the non-exposed shot regions are explained later in reference to FIG. 11.

For example, considered is a case where an aluminum wiring layer is used to form marks when the photoresist film is of positive type. In the shot regions (102) where ordinary exposure has been performed, the aluminum film is patterned in the form of wiring. On the other hand, in the non-exposed shot regions (102A), (102B) and (102C), the aluminum film remains on the entire surface without being patterned in the form of wiring. The non-exposed shot regions (102A), (102B) and (102C) function as marks, since an aluminum film pattern different from that of ordinary shot regions (102) is formed.

Figure 9:
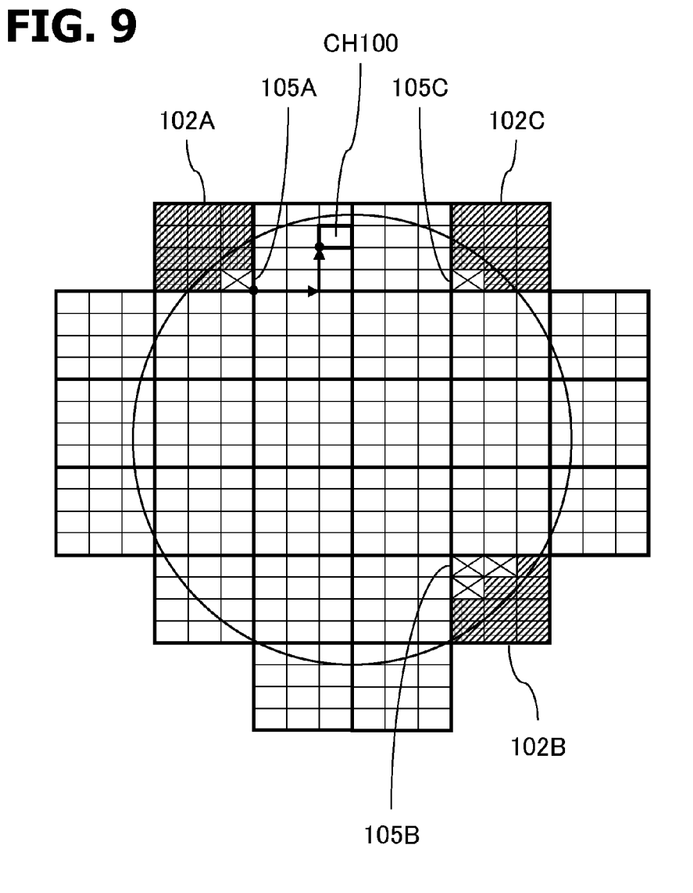
FIG. 9 is a schematic plan view illustrating an example of the relationship between marks and a reference chip.

FIG. 9 is a schematic plan view of a semiconductor wafer illustrating an example of the relationships between marks and a reference chip. In the non-exposed shot regions (102A), (102B) and (102C), marks (105A), (105B) and (105C) are respectively formed.

The non-exposed shot regions (102A), (102B) and (102C) are disposed at positions where they cross the edge of the semiconductor wafer (101), and the respective marks are shaped like fans. For example, the angle at the center of each fan-shaped mark can be decided as the position of the mark.

In the example illustrated in FIG. 9, the chip (CH100) apart from the mark (105A) by two chips rightward in the row direction and by two chips upward in the column direction is defined as the reference chip. The reference chip (CH100) can also be defined also on the basis of the other marks (105B) and (105C) respectively.

Figure 10:
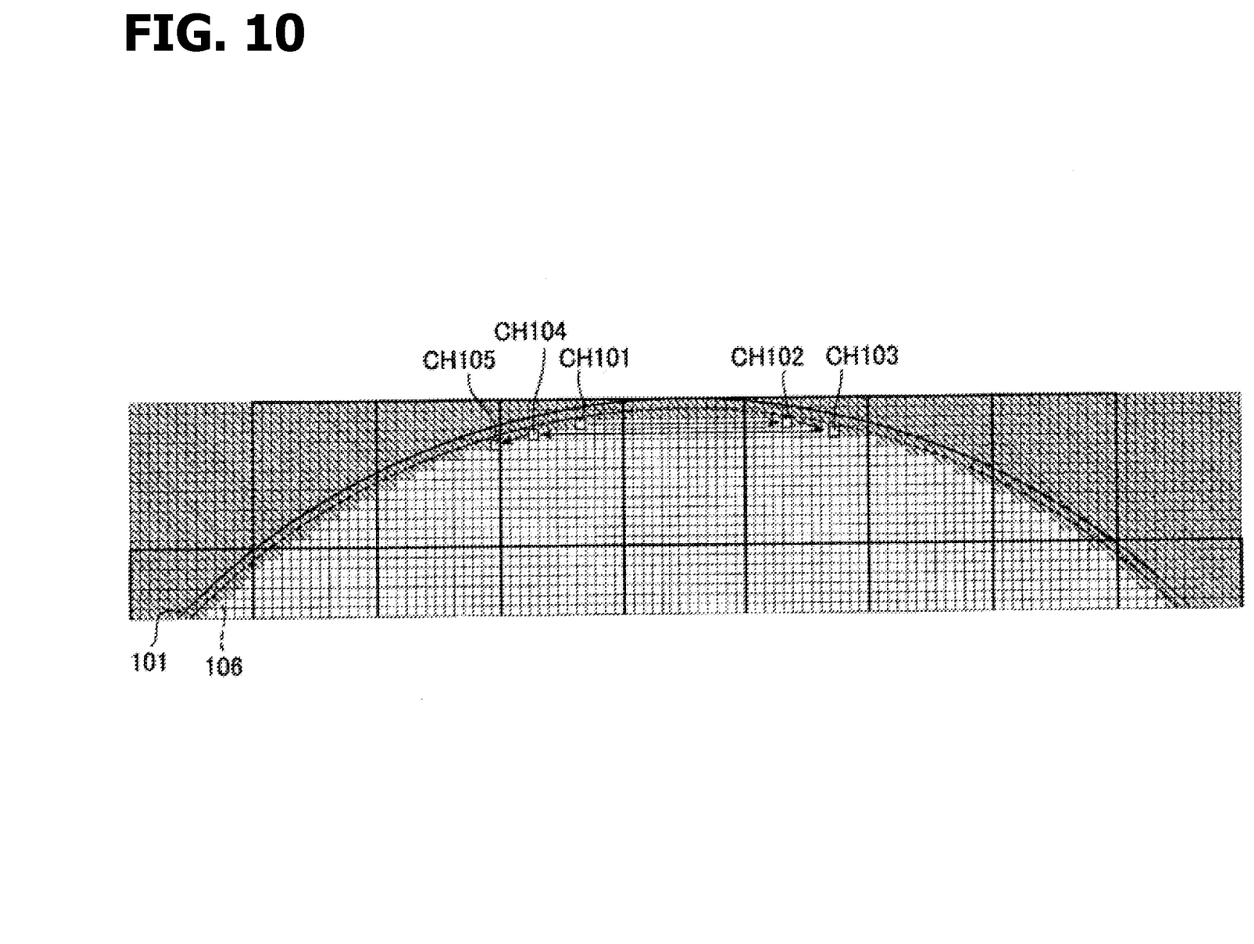
FIG. 10 is a schematic plan view of a semiconductor wafer illustrating an example of test procedure.

FIG. 10 is a schematic plan view of a semiconductor wafer illustrating an example of test procedure. Meanwhile, in this example, a block reticle different from the example explained in reference to FIG. 8A and the like is used.

Slightly inside the edge of the wafer (101), a border (106) for deciding ineffective chips is defined. The chips formed outside the border (106) and the chips on the border (106) are excluded from the test as ineffective chips. The ineffective chips are indicated by hatching. The chips contained inside the border (106) are tested as effective chips.

In the example illustrated in FIG. 10, the chip (CH101) at the left end of the uppermost row is decided as the reference chip (start chip) of the test process. The chips of the row where the chip (CH101) is disposed are tested chip by chip in the rightward direction in the order from the chip (CH101).

If the test is completed till the chip (CH102) at the right end of the row in which the chip (CH101) is disposed, the chips of the row immediately below the row are tested chip by chip in the leftward direction in the order from the chip (CH103) at the right end.

If the test is completed till the chip (CH104) at the left end of the row in which the chip (CH103) is disposed, the chips of the row further immediately below the row are tested chip by chip in the rightward direction in the order from the chip (CH105) at the left end. This procedure is repeated to test all the effective chips, for distinguishing acceptable chips from rejected chips.

In the meantime, the reason why marks are established at multiple places on a wafer as illustrated in FIG. 9 is explained below. If at least one mark is formed, the reference chip can be specified. However, the numerous chips formed on a semiconductor wafer may be cut out partially multiple times rather than all the chips are cut out at a time.

For example, when chips are cut out for the first time, the chips in the upper left quadrant portion including the upper left mark (105A) may be cut out. In this case, the respective chips left on the semiconductor wafer cannot be specified on the basis of the mark (105A). If the individual chips cannot be specified, acceptable chips and rejected chips cannot be distinguished in the test. However, if the mark (105B) in the lower right quadrant portion or the mark (105C) in the upper right quadrant portion remains, the respective chips can be specified on the basis of either of the marks. In such a case, it is preferred to form marks at multiple places.

In the case where multiple marks are formed, a first mark can be disposed in a certain quadrant, and a second mark can be disposed in the quadrant positioned in the direction diagonal to the quadrant, a third mark being able to be disposed in either of the other quadrants.

The problem caused by the mark forming method of the comparative example is explained below.

Figure 11:
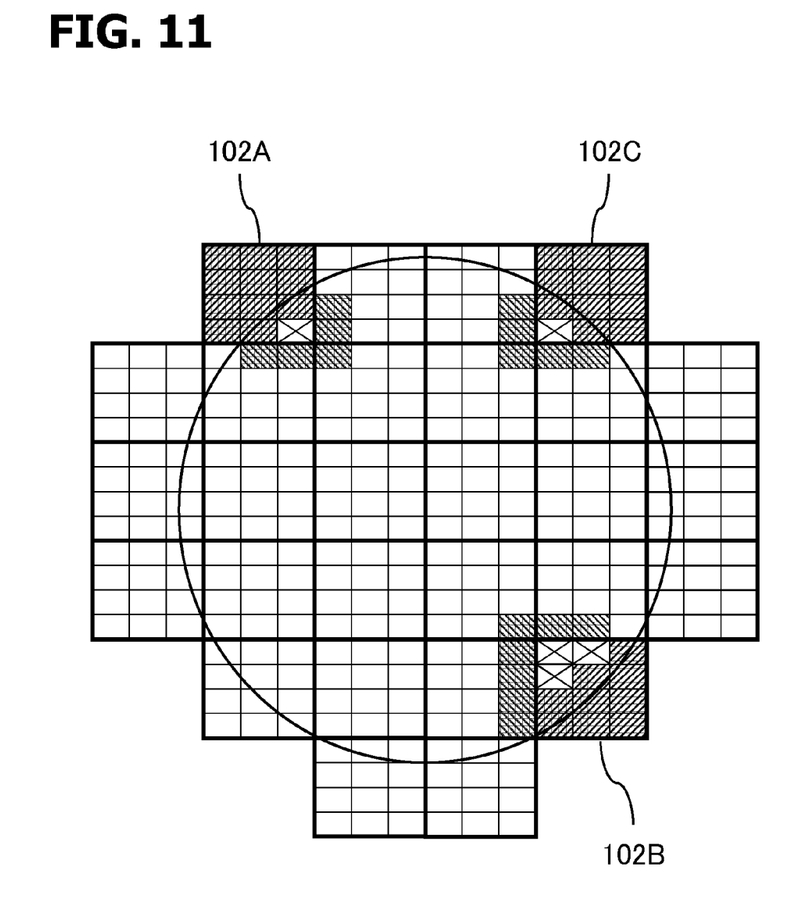
FIG. 11 is a schematic plan view of a semiconductor wafer illustrating a problem in the comparative example.

FIG. 11 is a schematic plan view of a semiconductor wafer for illustrating the problem of the comparative example. The chip regions indicated by cross hatching in the non-exposed shot regions (102A), (102B) and (102C) are the regions where effective chips should have been formed if the non-exposed shot regions (102A), (102B) and (102C) had been normally exposed and subjected to an ordinary chip production process. Like this, the mark forming method of the comparative example accompanies the reduction of effective chips.

In the chip regions indicated by leftward rising hatching lines adjacent to the non-exposed shot regions (102A), (102B) and (102C), effective chips can be formed but are likely to suffer failures.

The mark forming method of the comparative example changes the ordinary forming pattern in the mark forming regions almost as wide as shot regions. Being caused by it, in the chip regions adjacent to the mark forming regions, the uniformity of the ambient environment greatly declines compared with that in the regions wherein ordinary chip regions are adjacent to each other. For example, being caused by the differences in the area occupying rates of the patterns formed on the semiconductor wafer, wiring width failures, contact opening failures and the like are likely to occur. Thus, the mark forming method of the comparative example is likely to cause failures in the effective chips near the non-exposed shot regions.

A method for producing a semiconductor device as a first example of this invention is explained below.

Figure 1A:
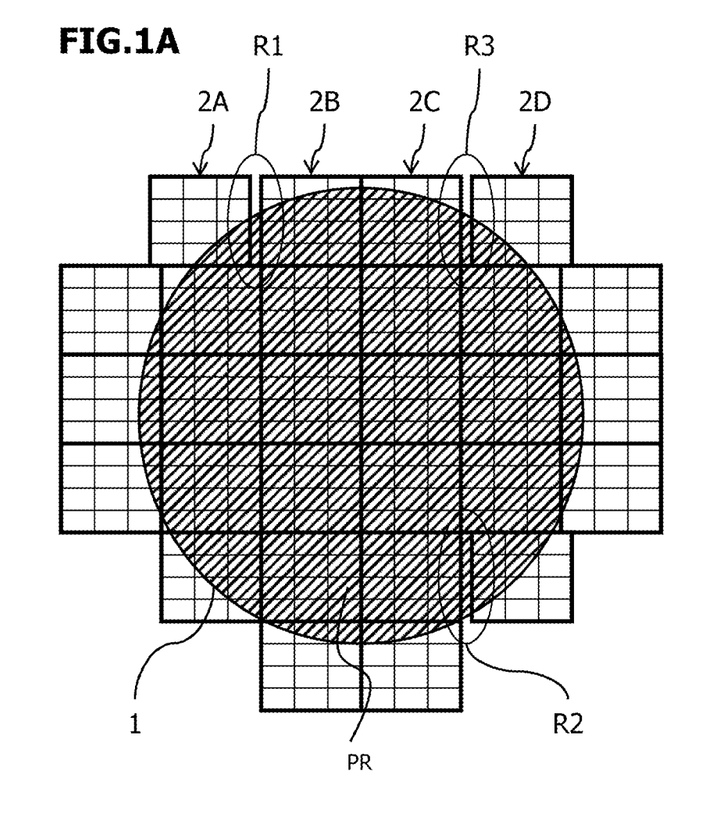
FIG. 1A is a wafer map diagram of a first example.

FIG. 1A is a wafer map diagram of the first example and illustrates a semiconductor wafer (1) having a photoresist film (PR) and the like (e.g., aluminum film) formed thereon. As explained below, on the semiconductor wafer (1), marks of the example are formed in region (R1) at the upper left edge portion, region (R2) at the lower right edge portion and region (R3) at the upper right edge portion respectively surrounded by an ellipse.

Figure 1B:
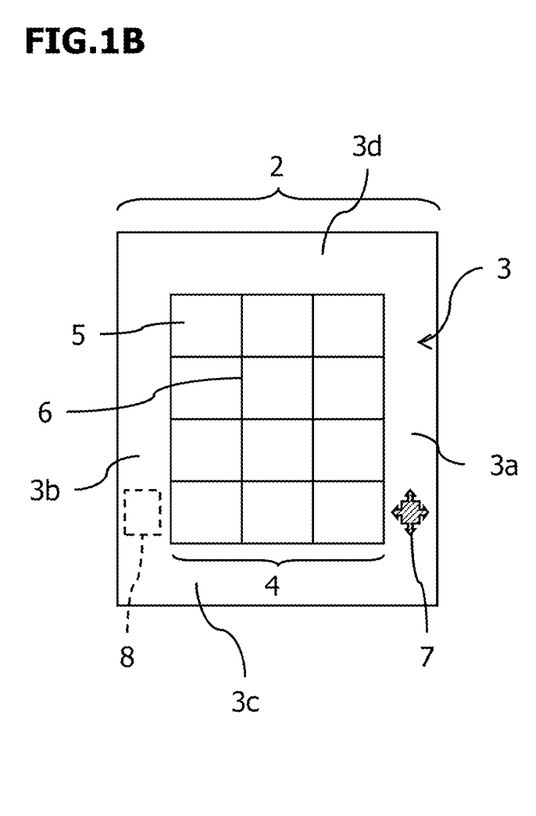
FIG. 1B is a schematic plan view illustrating a shot region or an exposure mask in the first example.

FIG. 1B is a schematic plan view illustrating a shot region (2) or the shot region corresponding portion of an exposure mask (reticle) in the first example.

The shot region (2) is rectangular. The shot region (2) contains a peripheral scribe region (3) disposed in the peripheral portion of the shot region (2) and an inside region (4) disposed inside the peripheral scribe region (3). Meanwhile, in this case, a rectangle includes a square.

In the inside region (4), 12 chip regions (5) are arranged in 3 columns and 4 rows in this example. In each of the chip regions (5), a mask pattern for forming a semiconductor chip is formed. Between the chip regions (5), scribe regions (6) are disposed. To avoid complicated illustration, the scribe regions (6) are indicated by light lines in FIG. 1B and the like, but the scribe regions (6) are equal to the peripheral scribe region (3) in width.

In the first example, the photoresist film formed on the semiconductor wafer (1) is of positive type. For example, the aluminum film formed below the photoresist film is patterned to form an aluminum wiring layer, and the process of forming the aluminum wiring layer is used to form marks. The exposure mask for forming the aluminum wiring layer has a light shielding pattern formed in the form of wiring in the portions for leaving the aluminum film and has a light transmitting pattern in the portions for removing the aluminum film.

In the exposure mask of the first example, the peripheral scribe region (3) and the scribe regions (6) are formed as light transmitting regions. The peripheral scribe region (3) has sides (3a) and (3b) opposite to each other and sides (3c) and (3d) opposite to each other in the direction crossing the sides (3a) and (3b).

On the side (3a), a mark pattern (7) is formed as a light shielding pattern. On the side (3b), at the position opposite to the mark pattern (7) (the position at which the mark pattern (7) virtually moved in parallel to the side (3c) or (3d) arrives), a cover pattern (8) is disposed. The cover pattern (8) of the first example is a light transmitting portion with a size to contain the mark pattern (7). The edges of the light transmitting portion as the cover pattern (8) are indicated by a broken line.

Meanwhile, in order to avoid complicated illustration, FIG. 1A and the like are simplified. With regard to the number of chips formed on one semiconductor wafer and the like, a more actual example is explained below. The diameter of a semiconductor wafer is, for example, 300 mm, and the size of each chip is, for example, an approx. 1 mm square. On one semiconductor wafer, for example, approx. 65000 effective chips are formed. The border of ineffective chips is set, for example, at approx. 3 mm to approx. 5 mm inside from the edge of the semiconductor wafer. The width of each of the peripheral scribe regions and the width of each of the scribe regions between the chip regions are, for example, approx. 100 µm respectively.

As explained below, the exposure to the shot regions (2A), (2B), (2C) and (2D) of the uppermost row illustrated in FIG. 1A is used to form marks in the regions (R1) and (R3). Meanwhile, the mark of the region (R2) can also be formed by the same method.

Figure 2:
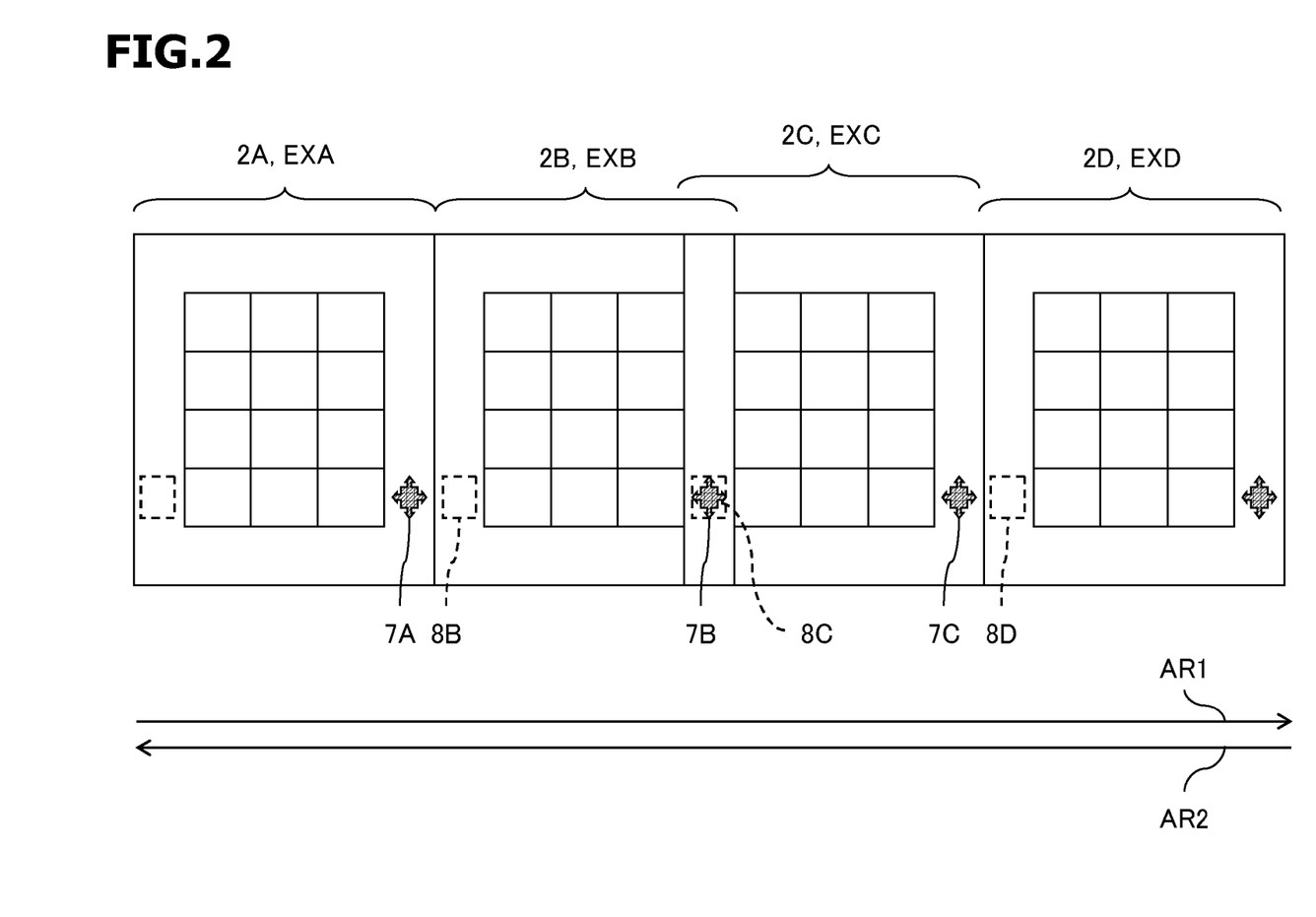
FIG. 2 is a schematic plan view illustrating a mark forming process in the first example.

FIG. 2 is a schematic plan view illustrating the mark forming process in the first example. The exposures in the shot regions (2A), (2B), (2C) and (2D) are indicated respectively by EXA, EXB, EXC and EXD. Further explanation is made in reference to FIGS. 1A, 1B and 2.

Explanation is made in reference to a case where shot regions are scanned from left to right, that is, exposures are performed in the order of shot regions (2A), (2B), (2C) and (2D). The scanning direction is indicated by arrow (AR1). The scanning direction is parallel to the sides (3c) and (3d) of the peripheral scribe regions. The mark patterns (7) and the cover patterns (8) are formed respectively on the sides (3a) and (3b) crossing the scanning direction in the peripheral scribe regions.

At first, the exposure (EXA) is performed in the shot region (2A). The shot region (2A) is disposed at the upper left edge portion of the semiconductor wafer (1) and crosses the edge of the semiconductor wafer (1). Within the shot region (2A), the photoresist film is exposed at the lower right portion disposed on the semiconductor wafer (1).

In succession to the exposure (EXA) in the shot region (2A), the exposure (EXB) in the shot region (2B) is performed. The shot region (2B) is disposed at the position where the side (3a) of the peripheral scribe region of the shot region (2A) contacts the side (3b) of the peripheral scribe region of the shot region (2B).

In succession to the exposure (EXB) in the shot region (2B), the exposure (EXC) in the shot region (2C) is performed. The shot region (2C) is disposed at the position where the side (3a) of the peripheral scribe region of the shot region (2B) exactly overlaps with the side (3b) of the peripheral scribe region of the shot region (2C).

In succession to the exposure (EXC) in the shot region (2C), the exposure (EXD) in the shot region (2D) is performed. The shot region (2D) is disposed at the position where the side (3a) of the peripheral scribe region of the shot region (2C) contacts the side (3b) of the peripheral scribe region of the shot region (2D).

The shot region (2D) is disposed at the upper right edge portion of the semiconductor wafer (1) and crosses the edge of the semiconductor wafer (1). Within the shot region (2D), the photoresist film is exposed at the lower left portion disposed on the semiconductor wafer (1).

The mark pattern (7A) transferred by the exposure (EXA) is not covered by the cover pattern (8B) transferred by the exposure (EXB). Therefore, the mark pattern (7A) is finally transferred onto the photoresist film. Thus, the mark pattern (7A) is transferred onto the upper left edge region (R1).

On the other hand, the mark pattern (7B) transferred by the exposure (EXB) is covered by the cover pattern (8C) transferred by the exposure (EXC). Thus, the transfer of the mark pattern (7B) is made ineffective. The cover pattern (8C) is merely a portion of the light transmitting peripheral scribe region (3), and therefore the transfer of the cover pattern (8C) does not form any pattern. Thus, the mark pattern (7B) is not finally transferred onto the photoresist film.

The mark pattern (7C) transferred by the exposure (EXC) is not covered by the cover pattern (8D) transferred by the exposure (EXD). Consequently, the mark pattern (7C) is finally transferred onto the photoresist film. Thus, the mark pattern (7C) is transferred onto the upper right edge region (R3).

As explained above, in the region where the mark pattern (7) is not formed, the continuously exposed (adjacent) shot regions are disposed in such a manner that the cover pattern overlaps with the mark pattern. Thus, it is possible that the mark pattern (7) is not finally transferred.

On the other hand, in the region where the mark pattern (7) is formed, the continuously exposed (adjacent) shot regions are disposed in such a manner that the shot regions does not overlap each other and that the cover pattern does not overlap with the mark pattern. Thus, the mark pattern (7) can be finally transferred. The mark pattern (7) is formed on the peripheral scribe region (3).

In the case where the mark pattern (7) is not formed, the continuously exposed shot regions are disposed in such a manner that the paired sides of the peripheral scribe regions of every two shot regions adjacent to each other exactly overlap each other. That is, the exposure is performed in the state where the gap between the chip regions adjacent to each other becomes equal to the width of one scribe region.

In the first example, in the case where the mark pattern (7) is formed, the continuously exposed shot regions are disposed in such a manner that the adjacent shot regions contact each other. That is, compared with the case where the mark pattern (7) is not formed, an offset equal to the width of one scribe region is established, and the gap between the adjacent chip regions where the mark pattern (7) is disposed is equal to the width of two scribe regions.

Meanwhile, to facilitate the understanding of illustration in FIG. 1A, clearance is illustrated between the shot region (2A) and the shot region (2B) and also between the shot region (2C) and the shot region (2D). As illustrated in FIG. 2, according to the mark forming method of the first example, the shot region (2A) contacts the shot region (2B), and the shot region (2C) contacts the shot region (2D).

A mark forming method according to a modified first example is explained below. In the modified first example, the scanning direction is reverse to that of the mark forming method illustrated in FIG. 2 as the first example. That is, in this case, the shot regions are scanned from right to left, or in other words, exposures are performed in the order of shot regions (2D), (2C), (2B) and (2A). The scanning direction of this modified example is indicated by arrow (AR2). The shot regions (2A) to (2D) are disposed in the same manner as in the first example.

At first, the exposure (EXD) in the shot region (2D) is performed, and then the exposure (EXC) in the shot region (2C) is performed. Subsequently the exposure (EXB) in the shot region (2B) is performed, and then the exposure (EXA) in the shot region (2A) is performed.

The cover pattern (8D) transferred by the exposure (EXD) does not overlap with the mark pattern (7C) transferred by the exposure (EXC), and the mark pattern (7C) is transferred onto the photoresist film.

The mark pattern (7B) transferred by the exposure (EXB) overlaps with the cover pattern (8C) transferred by the exposure (EXC). The region where the mark pattern (7B) is going to be transferred has already been irradiated with light by the transfer of the cover pattern (8C), and consequently the mark pattern (7B) is not transferred.

The mark pattern (7A) transferred by the exposure (EXA) does not overlap with the cover pattern (8B) transferred by the exposure (EXB), and the mark pattern (7A) is transferred onto the photoresist film. Thus, even by the method according to the modified first example, mark patterns (7) are not formed in unnecessary places, and mark patterns (7) can be formed in desired places.

A method for producing a semiconductor device according to a second example is explained below. In the second example, the photoresist film formed on the semiconductor wafer (1) is of negative type.

Figure 3:
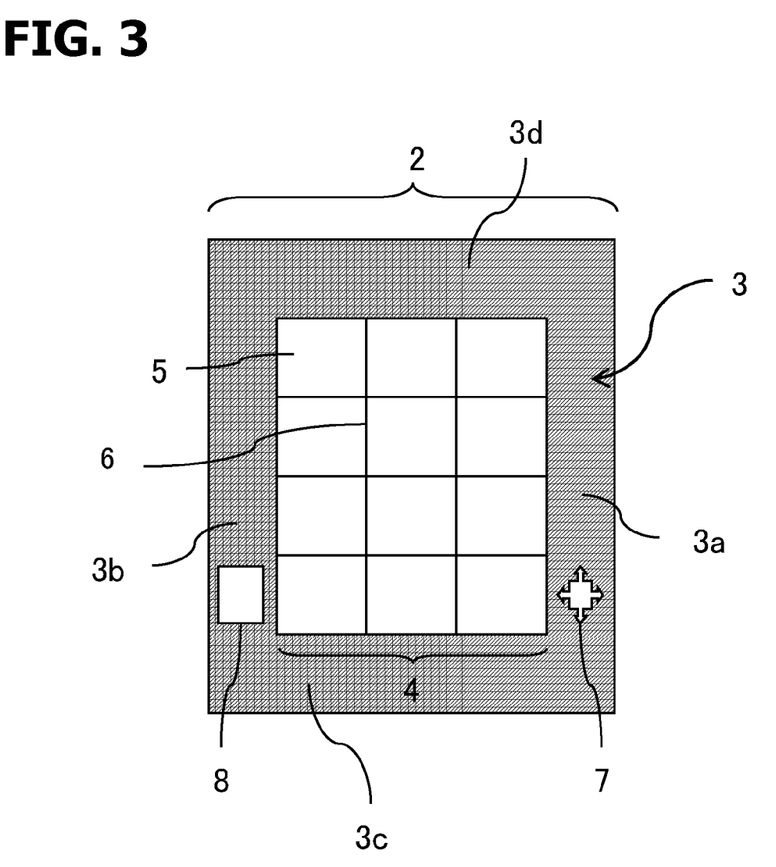
FIG. 3 is a schematic plan view illustrating a shot region or an exposure mask in a second example.

FIG. 3 is a schematic plan view illustrating a shot region (2) or the shot region corresponding portion of an exposure mask (reticle) in the second example.

The shot regions of the second example are basically reverse to the shot regions of the first example in polarity. For example, in the exposure mask for forming an aluminum wiring layer, a light transmitting pattern in the form of wiring is formed in the portions where the aluminum film remains, and a light shielding pattern is formed in the portions where the aluminum film is removed.

In the second example, the peripheral scribe region (3) and the scribe regions (6) are formed as light shielding regions. On the side (3a) of the peripheral scribe region, a mark pattern (7) is formed as a light transmitting pattern. On the side (3b) at the position opposite to the mark pattern (7), a cover pattern (8) is disposed. The cover pattern (8) of the second example is formed as a light transmitting region of, for example, a rectangular form with a size to contain the mark pattern (7).

Figure 4:
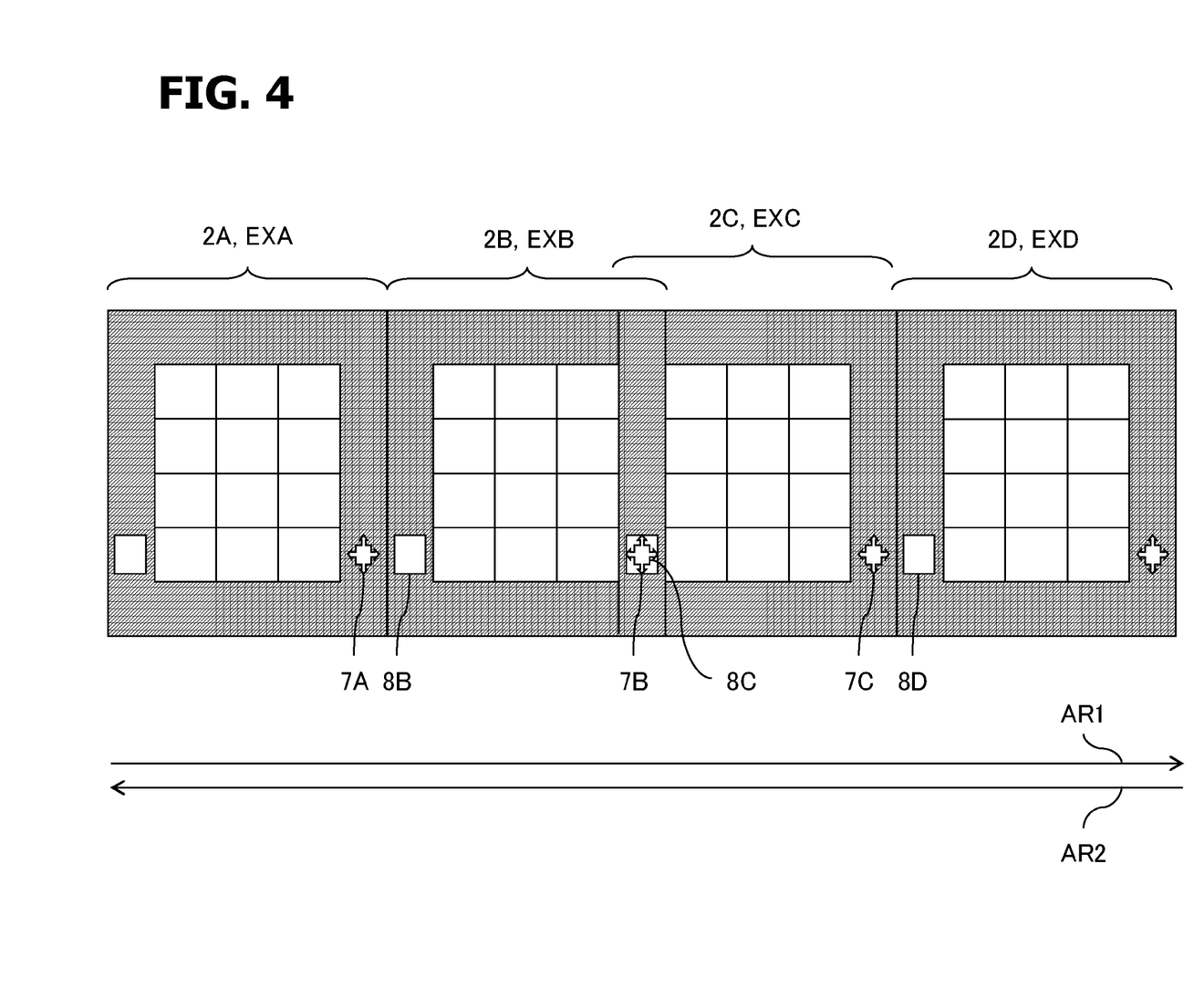
FIG. 4 is a schematic plan view illustrating a mark forming process in the second example.

FIG. 4 is a schematic plan view illustrating the mark forming process in the second example. The disposal of the shot regions (2A), (2B), (2C) and (2D) is identical to that of the first example. A case where the shot regions are scanned from left to right is explained. As in the first example, the exposure (EXA) in the shot region (2A), the exposure (EXB) in the shot region (2B), the exposure (EXC) in the shot region (2C) and the exposure (EXD) in the shot region (2D) are performed in this order.

The mark pattern (7A) transferred by the exposure (EXA) is not covered by the cover pattern (8B) transferred by the exposure (EXB). Therefore, in the shot region (2A), the mark pattern (7A) is formed. In the second example, the cover pattern (8) is formed as a light transmitting pattern disposed in the light shielding peripheral scribe region (3). Consequently, in the shot region (2B), the cover pattern (8B) of, for example, a rectangle is formed.

The mark pattern (7B) transferred by the exposure (EXB) is covered by the cover pattern (8C) transferred by the exposure (EXC). Therefore, the transfer of the mark pattern (7B) is made ineffective, and the cover pattern (8C) is formed. Thus, the mark pattern (7B) is not finally transferred onto the photoresist film.

The mark pattern (7C) transferred by the exposure (EXC) is not covered by the cover pattern (8D) transferred by the exposure (EXD). Therefore, in the shot region (2C), a mark pattern (7C) is formed. Further, in the shot region (2D), a cover pattern (8D) is formed.

A mark forming method according to a modified second example is explained below. The scanning direction in the modified second example is reverse to that of the second example as in the relation between the modified first example and the first example. The exposure (EXD) in the shot region (2D), the exposure (EXC) in the shot region (2C), the exposure EXB in the shot region (2B) and the exposure (EXA) in the shot region (2A) are performed in this order.

The mark pattern (7C) transferred by the exposure (EXC) does not overlap with the cover pattern (8D) transferred by the exposure (EXD), and the cover pattern (8D) is formed while the mark pattern (7C) is formed.

The mark pattern (7B) transferred by the exposure (EXB) overlaps with the cover pattern (8C) transferred by the exposure (EXC). Because of the transfer of the cover pattern (8C), the mark pattern (7B) is not transferred, and the cover pattern (8C) is formed.

The mark pattern (7A) transferred by the exposure (EXA) does not overlap with the cover pattern (8B) transferred by the exposure (EXB), and the cover pattern (8B) is formed while the mark pattern (7A) is formed.

Thus, according to the method of the modified second example as well as the method of the second example, mark patterns (7) are not formed in unnecessary places, and mark patterns (7) can be formed in desired places.

Meanwhile, in the second example and the modified second example, a rectangular cover pattern (8) is formed in the region where a mark pattern (7) is not formed. In the case where marks are used, the mark formed by the cover pattern (8) is disregarded. On the other hand, in the first example and the modified first example, in the region where a mark pattern (7) is not formed, a cover pattern (8) with a specific form is not formed. From a point of view that any mark caused by a cover pattern (8) unnecessary as a mark does not remain, the first example is considered preferred.

Figure 5:
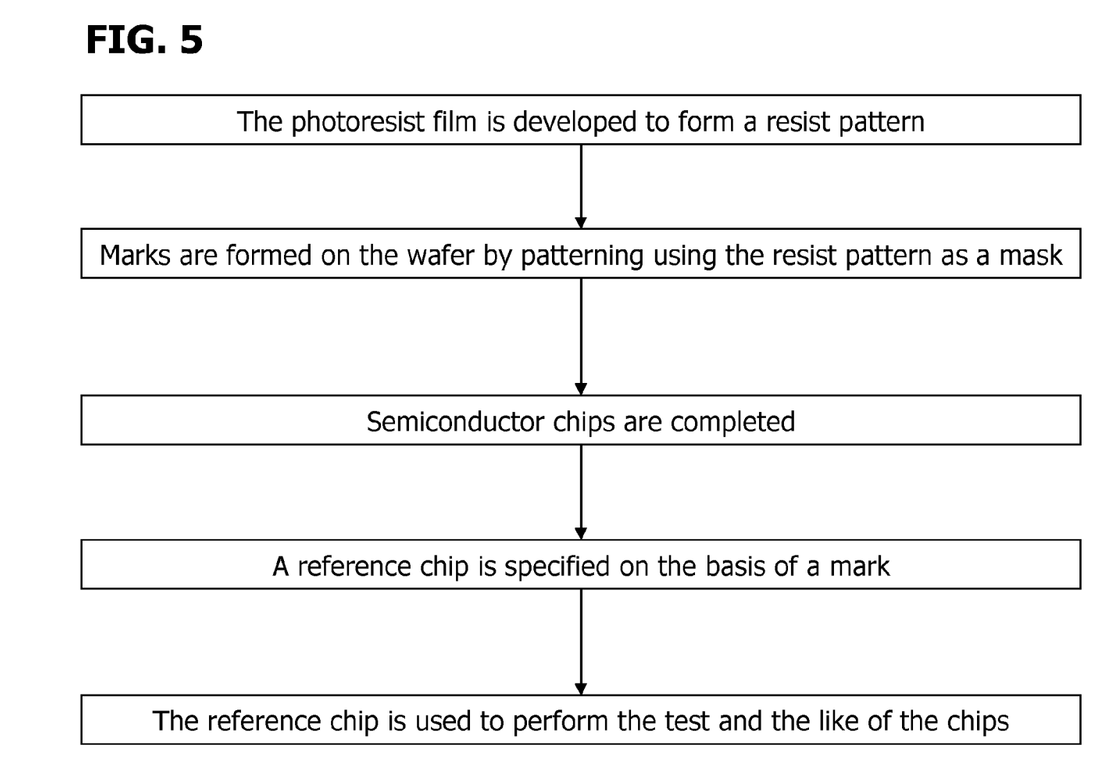
FIG. 5 is a schematic flowchart illustrating the flow from a mark forming process to a test process in an example.

FIG. 5 is a flowchart illustrating the flow from the subsequent mark forming process to the test process. After mark patterns are transferred onto the photoresist film, the photoresist film is developed to form a resist pattern. The resist pattern is used as a mask, to pattern, for example, an aluminum film for wiring, for forming marks on the semiconductor wafer.

The exposure for transferring a mark pattern onto the photoresist film is performed by using an exposure process for forming semiconductor chips. The patterning for forming a mark on the semiconductor wafer is performed using a patterning process for forming semiconductor chips.

After completion of semiconductor chips, the reference chip can be specified on the basis of the relative positional relationship with a mark. The other chips can also be specified on the basis of the relative positional relationships with the reference chip, for performing a test, etc.

Figure 6:
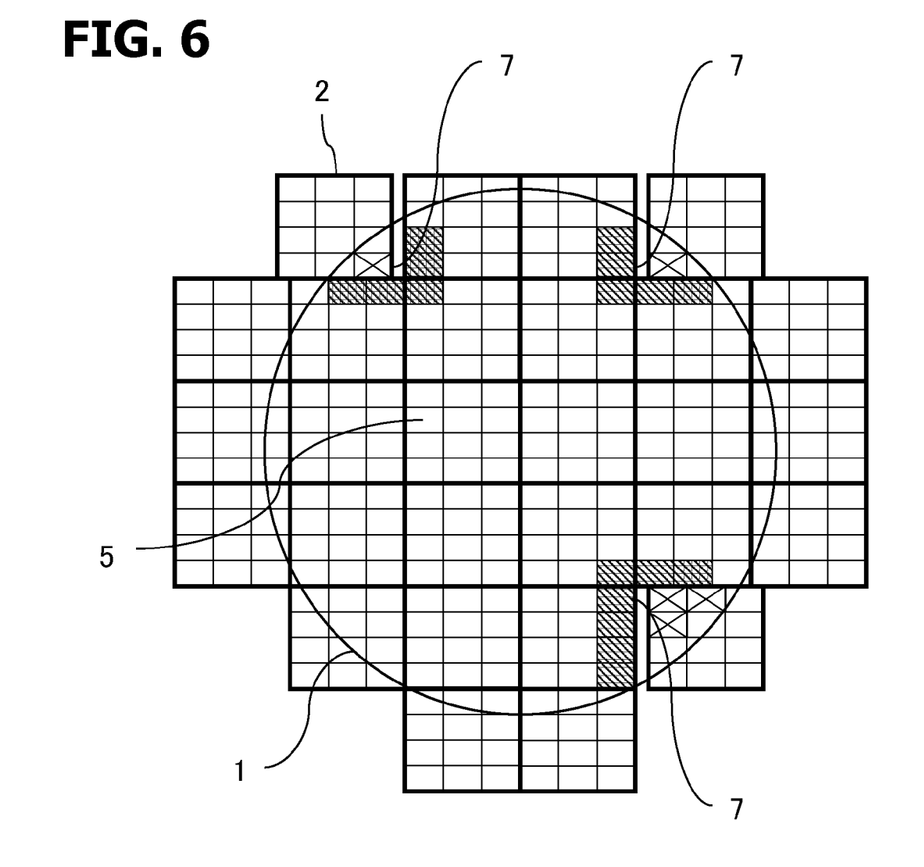
FIG. 6 is a schematic plan view of a semiconductor wafer on which marks and semiconductor chips are formed in an example.

FIG. 6 is a schematic plan view illustrating a semiconductor wafer (1), on which marks (7) are formed while semiconductor chips (5) are completed. Meanwhile in this case, for the convenience of explanation, the marks (7) formed on the semiconductor wafer (1) are referred to by the same reference number as that of the transferred mark patterns (7), and the semiconductor chips (5) are referred by the same reference number as that of chip regions (5).

As described above, in the mark forming methods of the examples, while exposure is performed in all the shot regions (2), the mark patterns (7) disposed in the peripheral scribe regions can be transferred onto the regions where the marks (7) are desired to be formed by designing the disposal relation between the shot regions.

The semiconductor chips indicated by cross hatching correspond to the effective chips made ineffective by the method of the comparative example. In the methods of the examples, non-exposed shot regions as formed in the comparative example are not produced, and an ordinary production process can be performed in all the chip regions. Therefore, the reduction of effective chips can be inhibited.

The semiconductor chips indicated by leftward rising hatching lines correspond to the effective chips that are adjacent to the non-exposed shot regions in the method of the comparative example and hence likely to suffer failures. In the methods of the examples, non-exposed shot regions as occurring in the comparative example are not produced, and the uniformity of the environment in and around the chip regions can be enhanced. Therefore, the occurrences of failures caused by the decline in the uniformity of environment can be inhibited.

Thus, in the methods of the examples, compared with the comparative example, the marks that can be used for specifying the reference chip can be formed by less affecting the chip production process, and therefore, the decline of chip yield can be inhibited.

A method for producing a semiconductor device according to a third example is explained below. In the first example and the second example, for example as illustrated in FIG. 2, the shot regions adjacent to each other (for example, shot regions (2A) and (2B) or shot regions (2C) and (2D)) are arranged in such a manner that they contact each other in the case where mark patterns are formed.

If a mark pattern (7) and a cover pattern (8) do not overlap each other between the shot regions adjacent to each other in scanning, the mark pattern (7) can be transferred. Consequently, the adjacent shot regions can also be disposed to be apart from each other.

Figure 7:
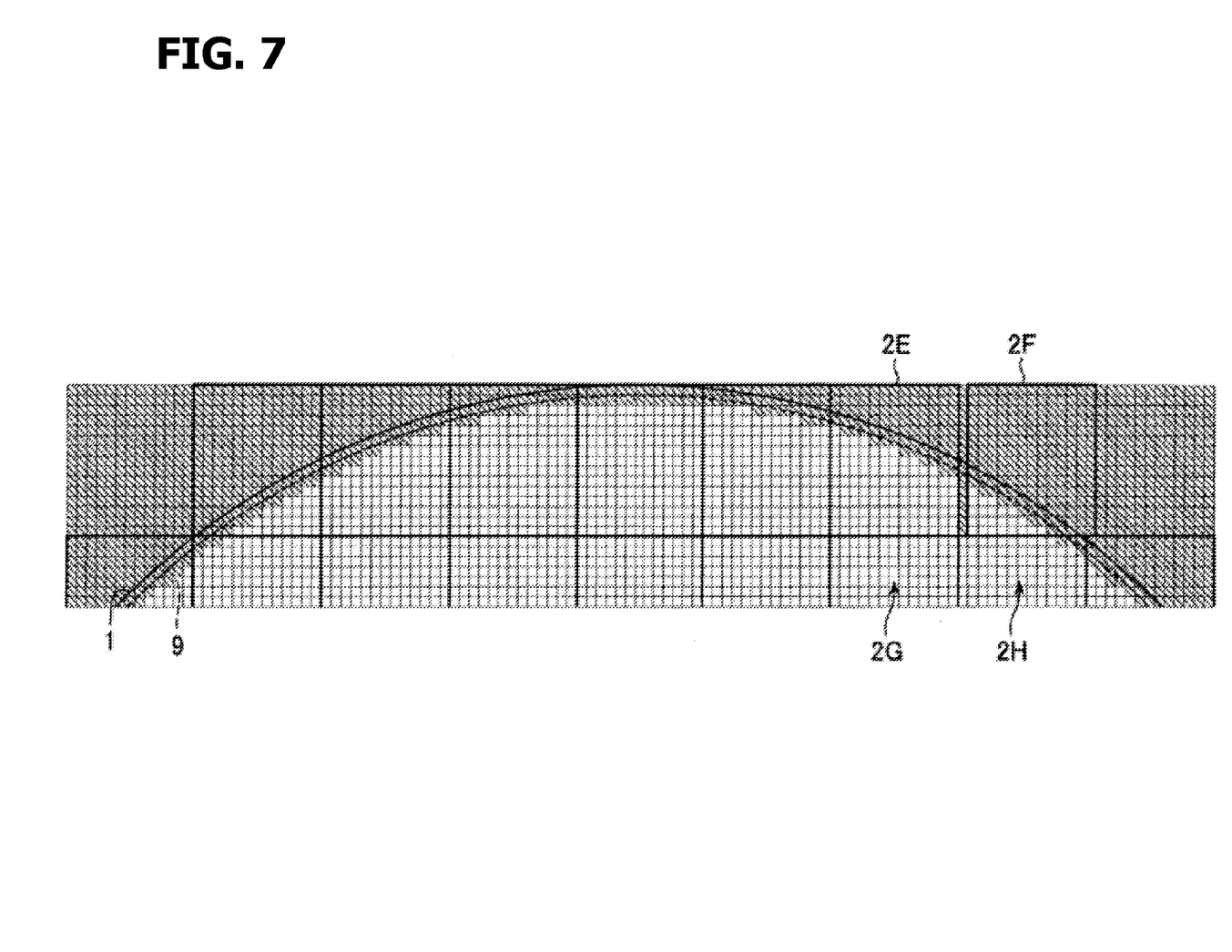
FIG. 7 is a schematic plan view illustrating a mark forming method in a third example.

As explained below, in the third example, the shot regions adjacent to each other in the case where a mark pattern (7) is formed are disposed to be apart from each other by a distance equal to the width of one chip region.

FIG. 7 is a schematic plan view illustrating the mark forming method according to the third example. For example, a case where a mark is formed at the upper right edge portion of the semiconductor wafer (1) is explained. Slightly inside the edge of the semiconductor wafer (1), a border (9) for deciding ineffective chips is defined. The ineffective chips are indicated by hatching.

The shot region (2F) at the upper right edge portion and the shot region (2E) adjacent to the shot region (2F) in the scanning direction and disposed on the left side (inside the wafer) in the same row as that of the shot region (2F) are disposed not to overlap each other, to form a mark pattern. For example, the mark pattern is formed on the right side of the peripheral scribe region of the shot region (2E).

In the third example, the shot region (2F) is disposed in such a manner that the left edge of the shot region (2F) shifts rightward from the right edge of the shot region (2E) by a distance equal to the width of one chip region. That is, compared with the case where no mark pattern (7) is formed, an offset equal to (the width of one scribe region+the width of one chip region) is established.

Below the shot region (2E), a shot region (2G) is disposed, and below the shot region (2F), a shot region (2H) is disposed. The shot region (2G) and the shot region (2H) are disposed to be horizontally adjacent to each other in such a manner that the paired sides of the peripheral scribe regions of both the shot regions exactly overlap each other.

The shot region (2E) and the shot region (2G) are disposed to be vertically adjacent to each other in such a manner that the paired sides of the peripheral scribe regions of both the shot regions exactly align each other. The shot region (2F) and the shot region (2H) are disposed to be vertically adjacent to each other in such a manner that the paired sides of the peripheral scribe regions of both the shot regions exactly align each other.

For example, in the first example, as can be seen from FIG. 1A, the shot regions disposed at irregular intervals in the horizontal direction for forming mark patterns (for example, the shot regions (2A) and (2D)) do not match the shot regions disposed adjacently below them in the scribe region sides extending in the vertical direction.

In the third example, the shot region (2F) is disposed apart from the shot region (2E) by a distance equal to the width of one chip region, and consequently the vertically extending scribe region side of the shot region (2F) and the vertically extending scribe region side of the shot region (2H) align each other in such a manner that the vertically extending scribe region sides are disposed on a straight line. This, for example, facilitates dicing.

Meanwhile, in the third example, in the gap between the shot region (2F) and the shot region (2E), a non-exposed region equal to the width of a chip region is produced (the non-exposed region is indicated by hatching). Further, if the shot region (2F) is more apart from the shot region (2E), the number of effective chips that can be disposed in the shot region (2F) becomes less. If the chip size is smaller, the non-exposed region can be narrower, and the decrease in the number of effective chips can be less. Therefore, the method of shifting a shot region in such a manner that the scribe region portions may match each other as explained in the third example is considered to be an especially preferred method in the case where the chip size is relatively small (for example, 1 mm square or less).

Meanwhile, as the third example, presented is a case where the scanning direction is the horizontal direction on the paper surface (X direction), where a mark pattern is formed on a scribe region portion in the vertical direction on the paper surface (Y direction) and where the scribe region portions in Y direction are made to match each other. The technique of the third example can also be applied to a case where the scanning direction is Y direction, where a mark pattern is formed on a scribe region portion in X direction and where the scribe region portions in X direction are made to match each other. In this case, a mark can be formed by adjusting the disposal of shot regions in Y direction.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A method for producing semiconductor device comprising:
    performing a first exposure of a photoresist film formed on a semiconductor wafer via an exposure mask;
    performing a second exposure of the photoresist film via the exposure mask; and
    performing a third exposure of the photoresist film via the exposure mask, wherein:
    a second shot region projected onto the photoresist film by the second exposure is adjacent in a first direction to a first shot region projected onto the photoresist film by the first exposure, and a third shot region projected onto the photoresist film by the third exposure is adjacent in the first direction to the second shot region;
    the exposure mask is such that a shot region projected on the semiconductor wafer by one exposure has a rectangular form;
    the shot region includes a peripheral scribe region disposed at peripheral portion of the shot region and a chip region disposed inside the peripheral scribe region;
    the peripheral scribe region has a first side and a second side opposite to each other and crossing the first direction, and a third side and a fourth side opposite to each other and parallel to the first direction;
    a first pattern is disposed on the first side, and a second pattern is disposed on the second side at a position opposite to the first pattern;
    the photoresist film is of positive type, and the first pattern is formed as a light shielding pattern while the second pattern is formed as a light transmitting region with a size to contain the first pattern, or
    the photoresist film is of negative type, and the first pattern is formed as a light transmitting pattern while the second pattern is formed as a light transmitting region with a size to contain the first pattern;
    the first exposure and the second exposure are performed in such a manner that the first shot region and the second shot region do not overlap each other and that the first pattern of either of the first shot region and the second shot region and the second pattern of the other of the first shot region and the second shot do not overlap each other; and
    the second exposure and the third exposure are performed in such a manner that the first pattern of either of the second shot region and the third shot region and the second pattern of the other of the second shot region and the third shot region overlap each other.

2. The method for producing semiconductor device according to claim 1, wherein:
    the second exposure is performed in succession to the first exposure, and the third exposure is performed in succession to the second exposure;
    the second exposure is performed in such a manner that the second pattern transferred by the second exposure does not overlap with the first pattern transferred to the photoresist film by the first exposure; and
    the third exposure is performed in such a manner that the second pattern transferred by the third exposure overlaps with the first pattern transferred to the photoresist film by the second exposure.

3. The method for producing semiconductor device according to claim 1, wherein:
    the second exposure is performed in succession to the third exposure, and the first exposure is performed in succession to the second exposure;
    the second exposure is performed in such a manner that the second pattern transferred by the second exposure overlaps with the first pattern transferred to the photoresist film by the third exposure; and
    the first exposure is performed in such a manner that the second pattern transferred by the first exposure does not overlap with the first pattern transferred to the photoresist film by the second exposure.

4. The method for producing semiconductor device according to claim 1, wherein:
    the second exposure is performed in succession to the first exposure, and the third exposure is performed in succession to the second exposure;
    the second exposure is performed in such a manner that the first pattern transferred by the second exposure does not overlap with the second pattern transferred to the photoresist film by the first exposure; and
    the third exposure is performed in such a manner that the first pattern transferred by the third exposure overlaps with the second pattern transferred to the photoresist film by the second exposure.

5. The method for producing semiconductor device according to claim 1, wherein:
    the second exposure is performed in succession to the third exposure, and the first exposure is performed in succession to the second exposure;

the second exposure is performed in such a manner that the first pattern transferred by the second exposure overlaps with the second pattern transferred to the photoresist film by the third exposure; and the first exposure is performed in such a manner that the first pattern transferred by the first exposure does not overlap with the second pattern transferred to the photoresist film by the second exposure.

6. The method for producing semiconductor device according to claim 1, wherein the first exposure and the second exposure are performed in a state where the first shot region and the second shot region contact each other.

7. The method for producing semiconductor device according to claim 1, wherein the first exposure and the second exposure are performed in a state where an edge of the first shot region on the second shot region side and an edge of the second shot region on the first shot region side are apart from each other by a distance equal to a width of the chip region.

8. The method for producing semiconductor device according to claim 1, wherein the first shot region is disposed at a position crossing an edge of the semiconductor wafer.

9. The method for producing semiconductor device according to claim 1, further comprising using a resist pattern formed by developing the photoresist film to which the first pattern is transferred by the first exposure and the second exposure, as a mask, to pattern a first film formed below the photoresist film, thereby forming a mark.

10. The method for producing semiconductor device according to claim 9, wherein the first film is formed of wiring material.

11. The method for producing semiconductor device according to claim 9, wherein the first exposure, the second exposure and the third exposure are included in exposures performed for forming multiple semiconductor chips on the semiconductor wafer, further comprising specifying a reference chip among the multiple semiconductor chips on the basis of the mark.

12. The method for producing semiconductor device according to claim 11, further comprising specifying the other chips among the multiple semiconductor chips on the basis of the reference chip, and testing the multiple semiconductor chips.

13. A semiconductor device comprising:

multiple chip regions formed on a semiconductor wafer and disposed in one direction;

gaps formed between the chip regions respectively adjacent to each other; and a mark, wherein:

a first gap between a first chip region among the multiple chip regions and a second chip region inside the semiconductor wafer and adjacent to the first chip region has a first width, and a second gap between the first chip region and a third chip region outside the semiconductor wafer and adjacent to the first chip region has a second width wider than the first width; and the mark is formed on the second gap, and is not formed on the first gap.

14. A method for producing semiconductor device comprising:

preparing a semiconductor wafer which comprises multiple chip regions formed on a semiconductor wafer and disposed in one direction, gaps formed between the chip regions respectively adjacent to each other, and a mark, wherein a first gap between a first chip region among the multiple chip regions and a second chip region inside the semiconductor wafer and adjacent to the first chip region has a first width, and a second gap between the first chip region and a third chip region outside the semiconductor wafer and adjacent to the first chip region has a second width wider than the first width, and the mark is formed on the second gap, and is not formed on the first gap; and specifying a reference chip region among the multiple chip regions on the basis of the mark.

15. The method for producing semiconductor device according to claim 14, further comprising:

specifying the other chip regions among the multiple chip regions on the basis of the reference chip region; and testing the multiple chip regions.

* * * * *